United States Patent

Kataoka et al.

[11] 4,107,718
[45] Aug. 15, 1978

[54] BULK SEMICONDUCTOR LOGIC DEVICE

[75] Inventors: Shoei Kataoka, Tanashi; Nobuo Hashizume, Kawasaki; Hiroshi Kodera, Kunitachi, all of Japan

[73] Assignee: Agency of Industrial Science & Technology, Tokyo, Japan

[21] Appl. No.: 784,697

[22] Filed: Apr. 5, 1977

Related U.S. Application Data

[63] Continuation-in-part of Ser. No. 598,257, Jul. 23, 1975, abandoned.

[30] Foreign Application Priority Data

Jul. 24, 1974 [JP] Japan .................................. 49-84247

[51] Int. Cl.² ............................................ H01L 27/26
[52] U.S. Cl. ......................................... 357/3; 307/216; 307/217; 307/218; 307/299 R; 357/55
[58] Field of Search ................. 357/3, 55; 307/299 R, 307/216, 217, 218; 331/107 G

[56] References Cited

U.S. PATENT DOCUMENTS

| | | | |
|---|---|---|---|
| 3,538,400 | 11/1970 | Yanai et al. | 357/3 |
| 3,566,306 | 2/1971 | Esposito et al. | 331/107 G |
| 3,602,734 | 8/1971 | Matsukura et al. | 307/299 |
| 3,766,372 | 10/1973 | Kataoka et al. | 357/3 |
| 3,991,328 | 11/1976 | Upadhyayula | 357/3 |
| 4,047,199 | 9/1977 | Kataoka et al. | 357/3 |

OTHER PUBLICATIONS

J. J. Chang, "Semiconductor Bulk Effect Full-Adder Circuit", *IBM Technical Disclosure Bulletin*, vol. 12, No. 1, Jun. 1969, pp. 6-8.

*Primary Examiner*—Stanley D. Miller, Jr.
*Assistant Examiner*—James W. Davie
*Attorney, Agent, or Firm*—Oblon, Fisher, Spivak, McClelland & Maier

[57] ABSTRACT

A semiconductor device including a cathode and an anode for applying a bias electric field to a semiconductor exhibiting negative conductivity under high electric field, a region in which the electric field is locally lower than that in other regions, at least two signal electrodes of field effect type additionally provided in the region of said lower field to which signals are supplied to control the generation of high electric field domains for the performance of logical operations.

12 Claims, 15 Drawing Figures

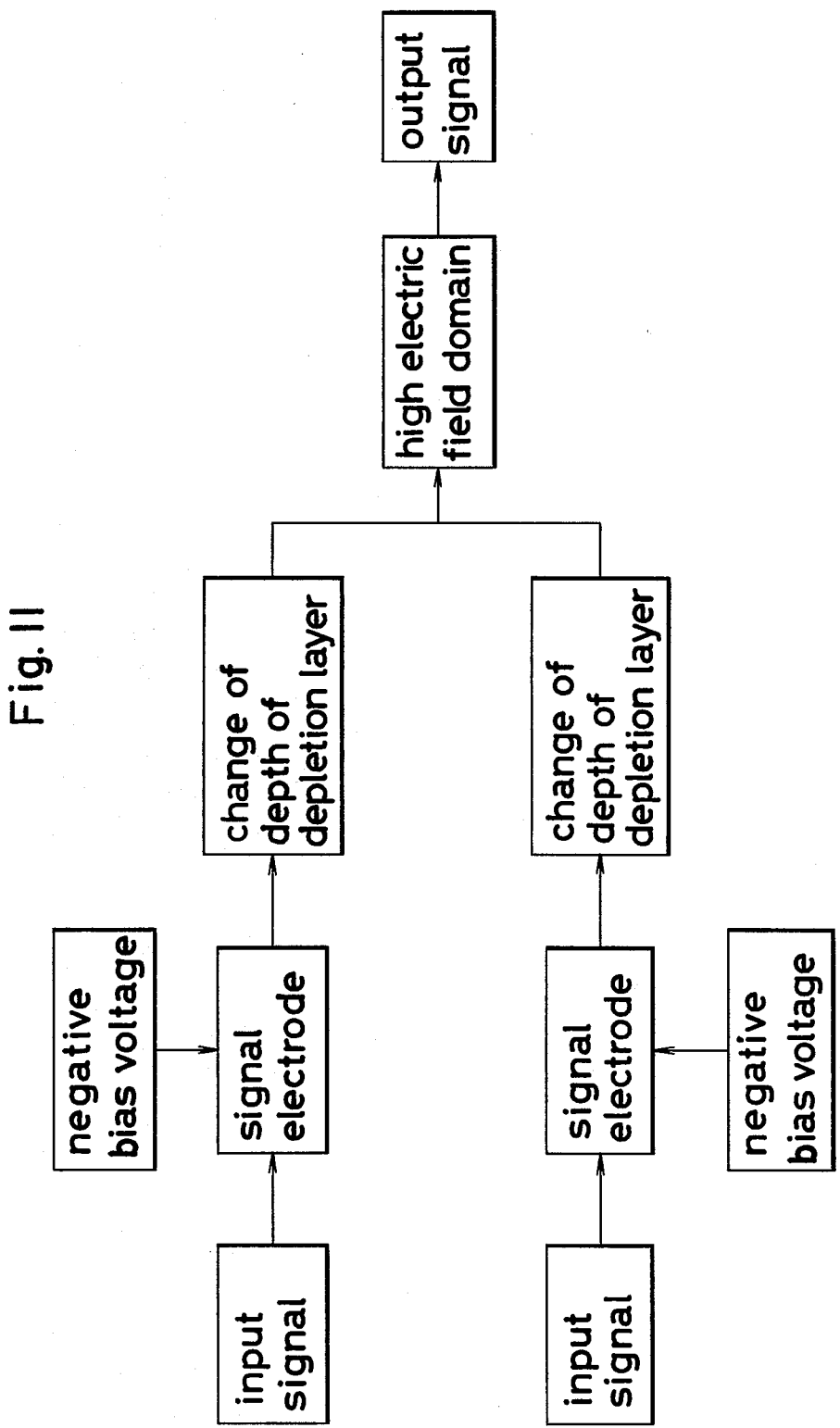

BULK SEMICONDUCTOR LOGIC DEVICE

REFERENCE TO COPENDING APPLICATION

This is a continuation-in-part application of our copending application U.S. Ser. No. 598,257 filed July 23, 1975, now abandoned.

BACKGROUND OF THE INVENTION

The present invention relates to a bulk semiconductor logic device and more particularly to a semiconductor device including a cathode and an anode for applying a bias electric field to a semiconductor exhibiting negative conductivity under high electric field, a region where the electric field is locally lower than that in the other regions, and at least two signal electrodes of field effect type additionally provided in the region of the lower field to which signals are supplied to control the generation of high electric field domains in the semiconductor for the performance of logical operations.

It is well-known in the art that in a semiconductor exhibiting negative conductivity under a high electric field, application of an electric field exceeding the threshold value of the semiconductor causes generation of a high electric field domain (a phenomenon known as the Gunn effect). It is further known that when a control electrode is provided on said device and a signal is applied to said electrode, generation of high electric field domains can be permitted or prevented, making possible a high speed logical operation. The structure of conventional devices for controlling the generation of high electric field domains in the semiconductor is such that a cathode and an anode are provided for biasing at each end of a semiconductor of uniform cross-section and resistivity to maintain the electric field in said semiconductor uniform and below the threshold value, and a high electric field domain is generated either by raising the electric field of the entire semiconductor by supplying a signal to the cathode or the anode or, by applying a signal voltage to an additional high electric field domain generating electrode provided on the semiconductor by means of Schottky junction, etc., to raise the electric field only in the region under the additional electrode.

The above structure, however, has disadvantages. First, the degree of fan-out obtainable is small if a high electric field domain is generated through application of a signal voltage to the cathode or the anode because of the low impedance between the cathode and anode. Second, when an additional high electric field domain generating electrode is used in a semiconductor of uniform section, a high electric field domain is apt to be generated under the electrode even in the absence of signal voltage application. And third, the bias electric field must be maintained considerably lower than the threshold value in order to overcome the second disadvantage and ensure stable control of high electric field domain generation. However, since decreasing the bias electric field gives decreased output voltage in the said Gunn effect, there is an output signal drop.

SUMMARY OF THE INVENTION

An object of the present invention is to provide a semiconductor logic device wherein high speed, complex logical operation can be performed.

Another object of the present invention is to provide a semiconductor logic device wherein the output signal is large enough to ensure stable logical operations when a number of the devices are connected in a circuit.

According to the present invention, a bulk semiconductor logic device having a bias electric field applying electrode at either end of a semiconductor exhibiting negative conductivity under high electric field, is provided with a region wherein the electric field is lower than that in other regions, said lower electric field region is provided with at least two signal electrodes of field effect type, means is provided to detect the presence of a high electric field domain in the semiconductor, and means is provided for supplying signal voltages to the signal electrodes.

With the above arrangement, generation of a high electric field domain in the said semiconductor region other than the lower electric field region is controllable by varying the voltages supplied to the signal electrodes and various complex logical operations can be performed in one semiconductor device.

Other objects and features of the present invention will be given in more detail with reference to the accompanying drawing.

BRIEF EXPLANATION OF THE DRAWINGS

FIG. 11 is a block diagram of performance of the logical operation according to the present invention.

DESCRIPTION OF PREFERRED EMBODIMENTS

Figure 1:
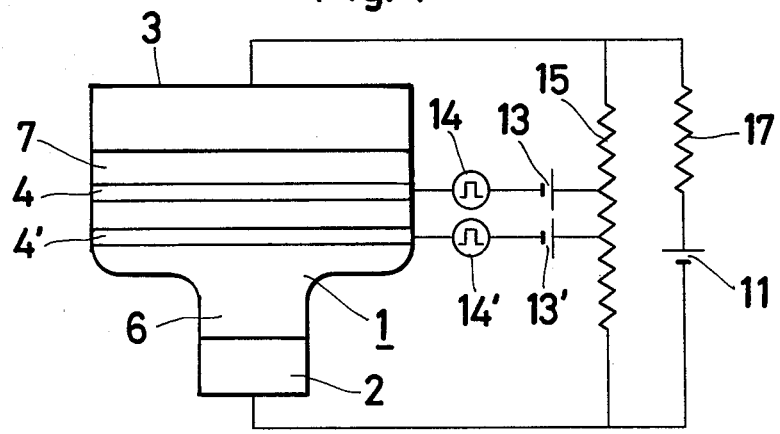
FIG. 1 is an explanatory view illustrating the principle of the bulk semiconductor logic device according to the present invention.
Figure 2A:
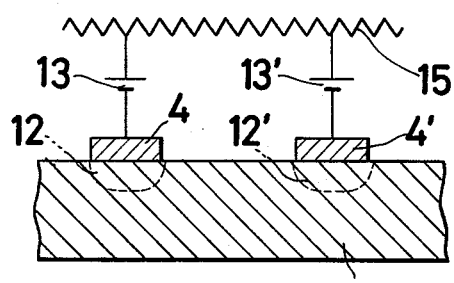
FIGS. 2(A), 2(B) and 2(C) are explanatory views illustrating the states in which the depletion layers are formed under the signal electrodes.
Figure 2B:
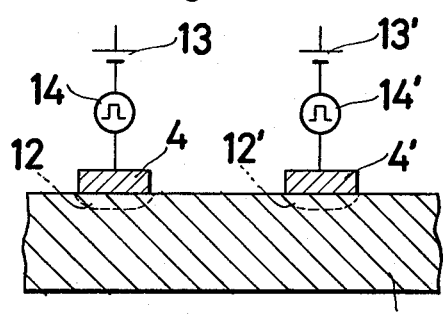
Figure 10:
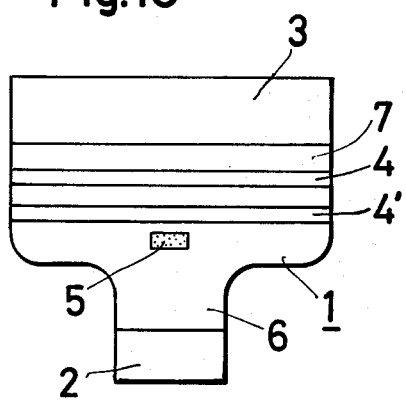

Referring now to FIG. 1 which illustrates the principle of the present invention, there is shown a semiconductor 1 comprising a narrow portion 6 at one end and a wide portion 7 at the other end. The narrow and wide ends are provided with a cathode 2 and an anode 3, respectively. Accordingly, when a bias voltage is applied to said semiconductor by a bias voltage applying means 11, the bias electric field of the wide portion 7 is made lower than that of the narrow portion 6. Said wide portion 7 has two signal electrodes 4 and 4' of field effect type which, as shown in FIG. 2(A), form depletion layers 12 and 12' thereunder when there is applied thereto a voltage which is negative with respect to said semiconductor thereunder by negative bias voltage applying means 13 and 13'. Thus, when negative bias voltages are applied to these signal electrodes 4 and 4' by means 13 and 13', the application of predetermined positive signal voltages 14 and 14' to the signal electrodes 4, 4' raises the electric field of the narrow portion 6 above the threshold value because the depths of depletion layers are reduced and the resistance of wide portion 7 is lowered as shown in FIG. 2(B) and a high electric field domain is generated in the vicinity of the cathode 2. The high electric field domain so generated runs toward the anode 3 and eventually disappears either in the wide portion 7 or on arriving at the anode 3 depending the precise structure of the said device. The generation and subsequent disappearance of the high electric field domain in said device gives rise to current changes through said device in pulse form. As a result, output voltage is readily available through serial connection of the said device with a load resistance such as resistor 17 in FIG. 1. Furthermore, by providing an output electrode on the device as shown in FIG. 10, existence of a high electric field domain in the device is detectable.

Figure 3A:
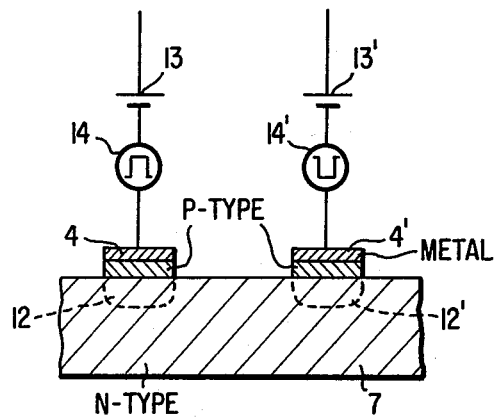
FIG. 3(A) is an explanatory diagram showing the state wherein the depletion layers are formed when a p-n junction is used as the signal electrodes.
Figure 3B:
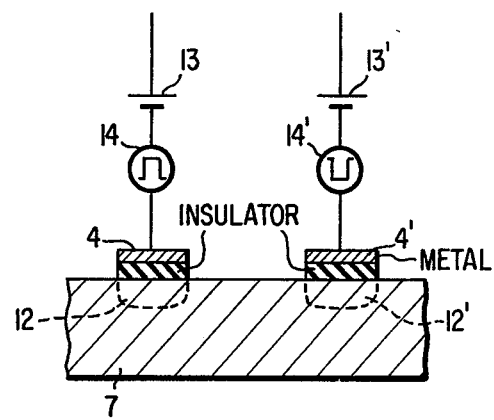
FIG. 3(B) is an explanatory diagram showing the state wherein the depletion layers are formed when a capacitive junction is used as the signal electrodes.

Any type of structure may be used for said signal electrodes 4 and 4', provided that the structures are of so called field effect type and of such a nature that with negative potential applied to the said signal electrodes with respect to those of the semiconductor thereunder depletion layers 12 and 12' are formed under the electrodes 4 and 4'. Examples of such structure are electrodes comprising Schottkey junction, p-n junction FIG. 3(A) or capacitive junction FIG. 3(B).

Figure 4:
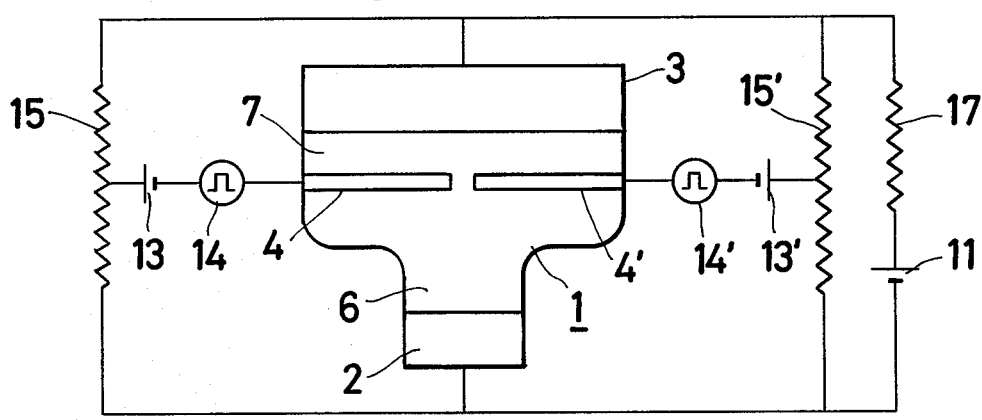
FIG. 4 is a front view of an embodiment of the device according to the present invention.

A resistor 15 in FIG. 1 and FIG. 2(A) and resistors 15 and 15' in FIG. 4 are provided to adjust the values of negative bias voltage to the electrodes 4 and 4'. A resistor 17 in FIG. 1 is a load resistor to detect the generation of a high electric field domain.

The case where an electrode comprising capacitive junction is used as the signal electrodes 4 and 4' will now be described. Negative potentials are applied to the signal electrodes as bias by negative bias applying means 13 and 13' and the potential of each electrode is varied independently by applying positive signal voltages 14 and 14' to change the thickness of the depletion layers 12 and 12' under each electrode. By so doing resistance of the wide portion 7 of the semiconductor is changed, and accordingly the electric field of the narrow portion 6 of the semiconductor 1 is changed if the bias voltage across said anode 3 and said cathode 2 is kept constant. Furthermore it may be arranged so that the electric field in said narrow portion of the semiconductor becomes greater than the critical value (that is, a high electric field domain is generated in said portion) as a result of a predetermined logical operation of two signals 14 and 14' applied to the signal electrodes 4 and 4'.

For example, the said device may be constructed in such a way that only when positive signal voltages 14 and 14' are applied to the signal electrodes 4 and 4' respectively, will the resistance of the said wide portion 7 of the semiconductor decrease enough for the electric field of the said narrow portion of the semiconductor 6 to go above the threshold value, resulting in generation of high electric field domain. In this case, AND operation is performed.

Similarly, by varying the width of each portion of the semiconductor 1, the bias conditions, and/or the signal levels the device can be made so that the electric field of the narrow portion 6 of the semiconductor exceeds the threshold value and a high electric field domain is generated when a positive signal voltage 14 or 14' is applied to either of the signal electrodes 4 and 4'. In this case, OR operation is performed.

Figure 2C:
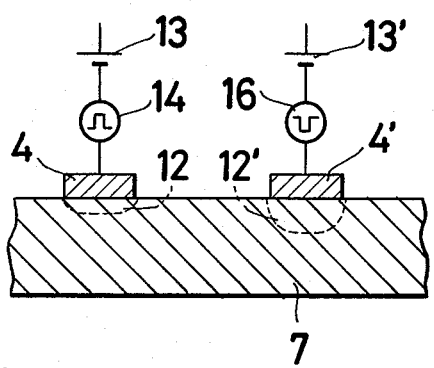

On the other hand, application of positive signal voltage 14 to either of the signal electrodes 4 and 4' and negative signal voltage 16 to the other makes possible INHIBITION operation. In this case, upon application of positive signal voltage 14 to one electrode 4, resistance of the wide portion 7 of the semiconductor 1 is decreased, the electric field of the narrow portion 6 of the semiconductor 1 is raised above the threshold value and a high electric field domain is generated. However, simultaneous application of negative signal voltage 16 to the other electrode 4' tends to decrease the resistance thus nullifying the effect of the positive signal voltage 14 as shown in FIG. 2(C), and thus the resistance of the narrow portion 6 of the semiconductor does not rise above the threshold value and, hence, no high electric field domain is generated. When, in the device of the construction shown in FIG. 1, the signal electrodes 4 and 4' are adapted to form depletion layers 12 and 12' thereunder, the input impedance is very high since the signal voltage is always applied to signal electrodes 4 and 4' having depletion layers 12 and 12' thereunder. This is advantageous in that when a logic circuit is composed of a number of similar elements much fan-out is obtainable. In addition, since the bias electric field of the wide portion 7 of the semiconductor provided with signal electrodes 4 and 4' is lower than the other portion, no generation of a high electric field domain occurs under signal electrodes 4 and 4'. Accordingly, the bias electric field at the narrow portion of the semiconductor 1 in which a high field domain is generated may be raised nearly up to the threshold value with resultant high sensitivity and large output signal voltage when a high electric field domain is generated.

Figure 5:
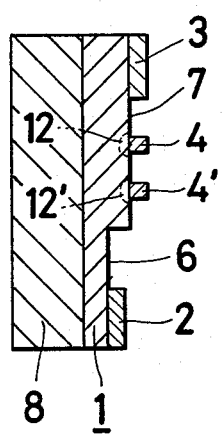
FIG. 5 is a sectional side view of another embodiment of the device according to the present invention.

FIG. 1 serves only for illustrating the principle of the present invention, and the same effect may be obtained by setting the bias electric field of the semiconductor at the position of the signal electrode lower than at the other portions and varying the resistance of said low electric field portion by means of input to the signal electrodes. Hence, actual embodiments of the present invention may take many forms. FIG. 4 is an embodiment of the present invention wherein the signal electrodes 4 and 4' are positioned at the same distance from the anode 3 and arranged individually so as to each occupy approximately half the width of the wide portion of the semiconductor. The same operating principle and functions as those of the device in FIG. 1 are applicable and AND, OR, INHIBITION operation, etc. can be performed. FIG. 5 shows another embodiment wherein the semiconductor portion 7 having the signal electrodes thereon is made thicker than the other portion 6 so as to lower the bias electric field. In this case, the width of the semiconductor need not necessarily be varied. The drawing shows a sectional view of the device of such construction. The semiconductor 1 is laid over the substrate 8 made of semi-insulating semiconductor, etc. The semiconductor 1 is thicker in the vicinity of the anode 3 than at other portions. Therefore, the electric field of that portion is low. Accordingly, the operating principle and the function of this device are the same as those of the device in FIG. 1.

Figure 6A:
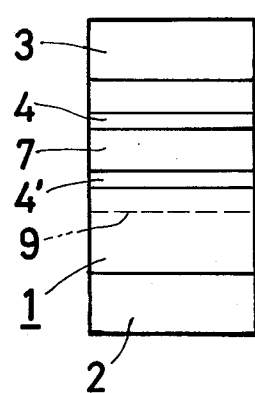
FIG. 6(A) is a front view of another embodiment of the device according to the present invention.
Figure 6B:
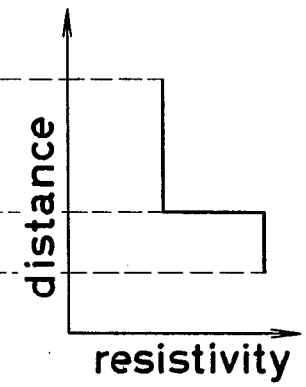
FIG. 6(B) is a graph showing the resistivity distribution within the device of FIG. 6(A), FIGS. 7 to 10 are front views of other embodiments of the devices according to the present invention.
Figure 7:
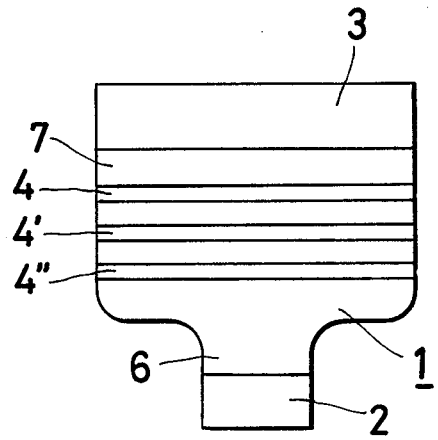
Figure 8:
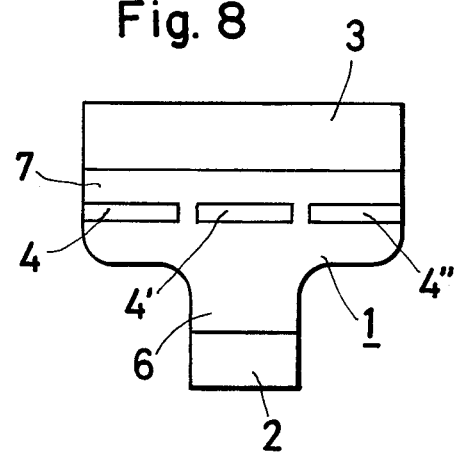

FIG. 6(A) shows still another embodiment wherein the resistivity of the semiconductor at the position 7 of the signal electrodes 4 and 4' is made lower than that of the other portions so as to lower the bias electric field. In order to obtain the above resistivity profile in the semiconductor, techniques for selective diffusion of Se or Sn may be employed. In this case, neither the width nor the thickness need necessarily be varied. Referring to FIG. 6(B), the resistivity of the semiconductor between the boundary 9 and the anode 3 is lower than that between the boundary 9 and the cathode 2. Hence, the electric field of that portion is low. Accordingly, the operating principle and function of this device are identical to those of the device in FIG. 1. The devices shown in FIGS. 1, 4, 5, 6(A) and 6(B) are embodiments wherein two signal electrodes are provided. According to the present invention three or more signal electrodes may be provided in the portion 7 of low bias electric field of the semiconductor. Embodiments employing three signal electrodes 4, 4' and 4'' are shown in FIGS. 7 and 8. In this case, the operating principle is the same as that of the devices shown in FIGS. 1, 4, 5, 6(A) and 6(B) and there may be performed by a single device and with faster operational speed such complex logical operations as logical majority decision in which an output signal is obtained only when the number of signal electrodes receiving a signal is the majority of the electrodes provided.

Figure 9:
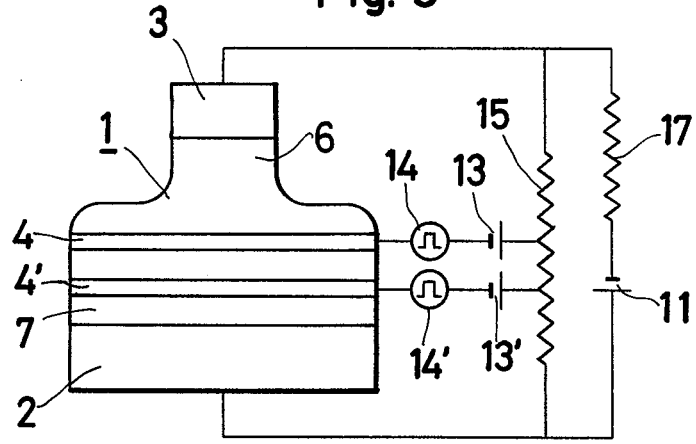

In the embodiments of the present invention so far described, the portion of the semiconductor wherein the electric field is set low is located in the vicinity of the anode 3. However, such portion need not necessarily be on the anode side and it may be on the cathode side as shown in FIG. 9. In this case, a high electric field domain is generated by the signals from the portion of the semiconductor having high bias electric field and runs toward the anode, disappearing thereat.

FIG. 10 is another embodiment wherein an output electrode 5 to detect the high electric field domain in the device in FIG. 1 is provided in the wide portion 7 of the semiconductor 1. The output electrode 5 may be of any structure that detects the potential of the semiconductor at the position where said output electrode is provided. For example, ohmic contact, Schottkey junction, p-n junction structure, etc., can be used. When a high electric field domain is generated in the narrow portion of the semiconductor by the inputs to the signal electrodes 4 and 4', the potential of the output electrode 5 is increased and positive output voltage is obtained. Therefore the output electrode 5 need not necessarily be provided in the wide portion 7 of the semiconductor as shown in FIG. 10 but may be provided in any portion of the semiconductor 1. This has an effect of simplifying the logic circuit through the fixed positive polarity of input and output signal voltages when it is considered that in OR and AND operations the signal voltages applied to the signal electrodes 4 and 4' are positive. Provision of the output electrode 5 makes it unnecessary to provide a load resistor such as resistor 17 in FIG. 1.

Briefly, in the device according to the present invention, control of high electric field domains in a semiconductor exhibiting negative conductivity under high electric field is accomplished by providing in the semiconductor of the device a portion of low bias electric field. The device performs stable logical operations, as shown in FIG. 11, through the provision of at least two signal electrodes of field effect type on said portion, the application of negative bias voltage to the signal electrodes so as to form depletion layers, the application of signal voltages to the signal electrodes so as to control the depths of the depletion layers and the taking-out of the high electric field domain generated, as the output signal. In particular miniaturization of the device results in enhanced fan out, large output voltages, high sensitivity and high efficiency. These characteristics of the device contribute greatly to stable, high speed logical operation. Furthermore, the device can be easily produced by conventional methods used in the production of semiconductor devices. It is apparent that the device according to the present invention is applicable to high speed data processing engineering with great benefit.

What is claimed is:

1. A bulk semiconductor logic device comprising
a bulk semiconductor body, said semiconductor body exhibiting negative conductivity under high electric field, said semiconductor body having bias electric field applying cathode and anode electrodes at opposite ends thereof, respectively, a portion of said semiconductor body having a lower electric field than that of other portions,
at least two signal electrodes of field effect type in said low field portion thereof, said signal electrodes of field effect type being of a nature to form a depletion layer in said semiconductor body thereunder when a voltage negative with respect to said semiconductor body thereunder is applied thereto,
means for applying bias voltage to said at least two signal electrodes, said bias voltage being of negative polarity with respect to the potential of the semiconductor body thereunder,
means for applying a signal voltage to each said signal electrode, and
means for detecting the presence of a high electric field domain in said semiconductor body.

2. A bulk semiconductor logic device according to claim 1 wherein said low electric field portion of said semiconductor body is wider than the other portions.

3. A bulk semiconductor logic device according to claim 1 wherein said low electric field portion of said semiconductor body is thicker than the other portions.

4. A bulk semiconductor logic device according to claim 1 wherein said low electric field portion of said semiconductor body is lower in resistivity of said semiconductor body than the other portions.

5. A bulk semiconductor logic device according to claim 1 wherein said low electric field portion is formed at the anode side.

6. A bulk semiconductor logic device according to claim 1 wherein said low electric field portion is formed at the cathode side.

7. A bulk semiconductor logic device according to claim 1 wherein said signal electrode of field effect type is a Schottky electrode.

8. A bulk semiconductor logic device according to claim 1 wherein said signal electrode of field effect type is a p-n junction electrode.

9. A bulk semiconductor logic device according to claim 1 wherein said signal electrode of field effect type is a capacitive electrode.

10. A method for logical operation by use of a bulk semiconductor device exhibiting negative conductivity under high electric field, said device having electrodes for application of a bias electric field at opposite ends thereof and a portion of lower electric field than in the remaining portion thereof, said portion of the lower electric field having attached thereto at least two signal electrodes of field effect type, said signal electrodes of field effect type being of a nature to form a depletion layer in said semiconductor device thereunder when a voltage negative with respect to said semiconductor device thereunder is applied thereto, which method comprises applying bias voltage to said at least two signal electrodes, said bias voltage being of negative polarity with respect to the potential of the semiconductor device thereunder and further applying a signal voltage to each of said at least two signal electrodes for effecting logical operation by detection of the presence of a high electric field domain in said semiconductor device.

11. A method as in claim 10 wherein and AND operation is carried out by applying a positive signal voltage to each of said at least two signal electrodes.

12. A method as in claim 10 wherein an OR operation is carried out by applying a positive signal voltage to either one of said at least two electrodes.

* * * * *